(12) United States Patent
Xu (10) Patent No.: US 10,311,775 B2
(45) Date of Patent: Jun. 4, 2019

(54) DISPLAY DEVICE

(71) Applicant: BOE TECHNOLOGY GROUP CO., LTD., Beijing (CN)

(72) Inventor: Pan Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/527,793

(22) PCT Filed: Jul. 1, 2016

(86) PCT No.: PCT/CN2016/088069
§ 371 (c)(1),
(2) Date: May 18, 2017

(87) PCT Pub. No.: WO2017/161729
PCT Pub. Date: Sep. 28, 2017

(65) Prior Publication Data
US 2018/0108292 A1 Apr. 19, 2018

(30) Foreign Application Priority Data

Mar. 23, 2016 (CN) ...................... 2016 2 0228730 U (51) Int. Cl.
*G09G 3/20* (2006.01)
*H05K 1/11* (2006.01)
(Continued)

(52) U.S. Cl.
CPC ......... *G09G 3/2092* (2013.01); *H01L 27/124* (2013.01); *H05K 1/118* (2013.01);
(Continued)

(58) Field of Classification Search
None
See application file for complete search history.

(56) References Cited

U.S. PATENT DOCUMENTS

2010/0109993 A1* 5/2010 Chang ................... G02F 1/1345
345/92
2012/0120123 A1* 5/2012 Adachi .................. G09G 3/342
345/690
(Continued)

FOREIGN PATENT DOCUMENTS

CN 101188081 A 5/2008
CN 104134429 A 11/2014
(Continued)

OTHER PUBLICATIONS

Search Report for International Patent Application No. PCT/CN2016/088069 dated Dec. 29, 2016.

*Primary Examiner* — Matthew Yeung
(74) *Attorney, Agent, or Firm* — Calfee, Halter & Griswold LLP (57) ABSTRACT

A display device includes a display panel and a control circuit board configured to provide a driving signal to the display panel. The display panel includes a plurality of pixel structures of which pixel structures arranged in one row are connected to one gate line. Pixel structures arranged in one column are connected to one data line. The control circuit board includes a driving chip, an end portion of each of the gate lines and an end portion of each of the data lines are respectively provided with panel pins. The control circuit board is provided with circuit board pins to be electrically connected with the panel pins, and connecting lines through which pins of the control circuit board are connected to the circuit board pins. A spacing between adjacent circuit board pins is larger than a spacing between adjacent pins of the driving chip connected with the circuit board pins.

18 Claims, 4 Drawing Sheets

(51) Int. Cl.
  *H05K 1/14*   (2006.01)
  *H05K 1/18*   (2006.01)
  *H01L 27/12*  (2006.01)

(52) U.S. Cl.
  CPC ............ *H05K 1/142* (2013.01); *H05K 1/189* (2013.01); *G09G 3/20* (2013.01); *G09G 2300/0426* (2013.01); *H05K 1/147* (2013.01); *H05K 2201/049* (2013.01); *H05K 2201/056* (2013.01); *H05K 2201/09027* (2013.01); *H05K 2201/09227* (2013.01); *H05K 2201/10128* (2013.01); *H05K 2201/10522* (2013.01)

(56) References Cited

U.S. PATENT DOCUMENTS

| | | | | |
|---|---|---|---|---|
| 2015/0103274 A1* | 4/2015 | Huang | ................... | G06F 3/0412 |
| | | | | 349/12 |
| 2017/0082982 A1* | 3/2017 | Cho | ................... | G04G 9/0064 |
| 2018/0024395 A1* | 1/2018 | Mitani | ................ | G02F 1/13454 |
| | | | | 349/150 |

FOREIGN PATENT DOCUMENTS

| | | | |
|---|---|---|---|
| CN | 104167195 | A | 11/2014 |
| CN | 104952418 | A | 9/2015 |
| JP | 2005077527 | A | 3/2005 |

\* cited by examiner

DISPLAY DEVICE

CROSS-REFERENCE TO RELATED APPLICATIONS

The present application is based on International Application No. PCT/CN2016/088069, filed on Jul. 1, 2016, which is based upon and claims priority to Chinese Patent Application No. 201620228730.1, filed on Mar. 23, 2016, and the entire contents thereof are incorporated herein by reference.

TECHNICAL FIELD

The present disclosure relates to the technical field of display, and more particularly to a display device.

BACKGROUND

Currently, electronic products, particularly hand-held electronic products, tend to have smaller sizes. COF (chip on flexible) technology is an important technology to realize the miniaturization of electronic products. COF technology means that a driving chip (IC) is designed on flexible material, and then the flexible material is folded to the back surface of a display panel, thus the display device can have a small overall size.

The inventors have found that the width of the border region of the conventional display device is still too large, and not only the appearance of the display device but also the display effect of the display device are affected, Therefore, the technical problem needs to be solved is to design a display device with a narrow border, and preferably the gate line fan-shaped wiring regions and data line fan-shaped wiring regions in the border region can be omitted.

SUMMARY

In view of the above problems, the present disclosure provides a display device, in which gate line fan-shaped wiring regions and data line fan-shaped wiring regions in the border region can be omitted, thereby realizing a narrow border design.

Embodiments of the present disclosure provide a display device comprising a display panel and a control circuit board configured to provide a driving signal to the display panel, the display panel comprises a plurality of pixel structures of which pixel structures arranged in one row are connected to one gate line, and pixel structures arranged in one column are connected to one data line, the control circuit board comprises a driving chip, an end portion of each of the gate lines and an end portion of each of the data lines are respectively provided with panel pins, the control circuit board is provided with circuit board pins to be electrically connected with the panel pins, and connecting lines through which pins of the control circuit board are connected to the circuit board pins, and a spacing between adjacent circuit board pins is larger than a spacing between adjacent pins of the driving chip connected with the circuit board pins.

It should be noted that, information disclosed in the above background portion is provided only for better understanding of the background of the present disclosure, and thus it may contain information that does not form the prior art known by those ordinary skilled in the art.

DETAILED DESCRIPTION

In order that those skilled in the art will better understand the technical solutions of the present disclosure, the present disclosure will be described in further detail with reference to the accompanying drawings and detailed description.

Figure 1:
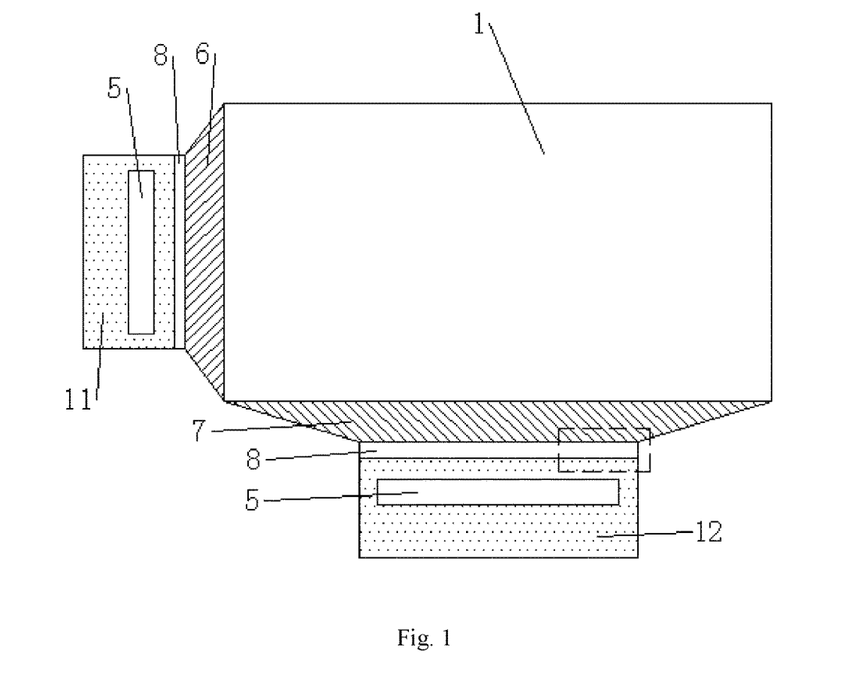
FIG. 1 is a schematic view showing a structure of a display device in the related art.
Figure 2:
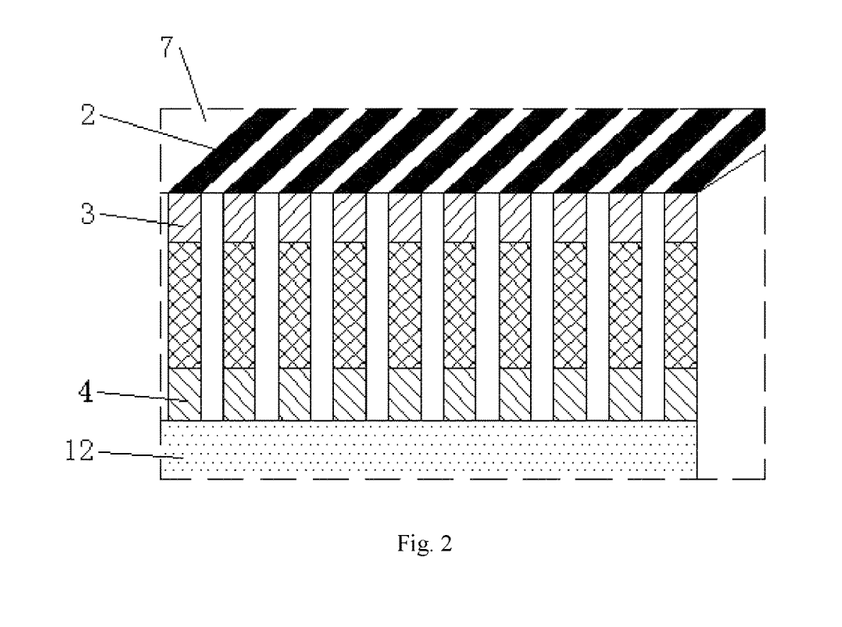
FIG. 2 is an enlarged view of a structure within a dashed box in FIG. 1.

FIG. 1 is a schematic view showing a structure of a conventional display device. FIG. 2 is an enlarged view of a structure within a dashed box in FIG. 1. As shown in FIGS. 1 and 2, the display device comprises a display panel 1 and a control circuit board configured to provide driving signals to the display panel 1. The display panel 1 comprises a plurality of pixel structures. Pixel structures in one row are connected to one gate line. Pixel structures in one column are connected to one data line 2. The control circuit board is made of flexible material by means of COF technology, and provided with circuit board pins 4. The control circuit board also comprises a driving chip 5. The circuit board pins 4 are electrically connected with the driving chip 5.

As shown in FIG. 1, the control circuit board comprises a gate line driving circuit board 11 and a data line driving circuit board 12, wherein, each of the gate lines is electrically connected to a corresponding circuit board pin 4 of the gate line driving circuit board 11 and each of the data lines is electrically connected to a corresponding circuit board pin 4 of the data line driving circuit board 12. Specifically, the end portion of each of the gate lines and the end portion of each of the data lines 2 are respectively provided with panel pins 3. The end portion of each of the gate lines and the end portion of each of the data lines 2 are electrically connected to the circuit board pins 4 through the panel pins 3 respectively. The regions where the panel pins 3 are electrically connected to the circuit board pins 4 are referred to as pin connection regions 8. All of the gate lines form gate line fan-shaped wiring regions 6 in wiring regions around the display panel 1, and all of the data lines 2 form data line fan-shaped wiring regions 7 in wiring regions outside the display panel 1.

The inventors have found that there are at least the following problems in the related art.

The conventional display device comprises, in an order from the center to the outside, a display panel 1, gate line fan-shaped wiring regions 6/data line fan-shaped wiring regions 7, pin connection regions 8, and a control circuit board. The gate line fan-shaped wiring regions 6/data line fan-shaped wiring regions 7 and the pin connection regions 8 are a part of a border region that is a non-display region (excluding the control circuit board which is folded to the back surface of the display panel where no pixel structure is provided). The width of each of the gate line fan-shaped wiring regions 6 or the width of each of the data line fan-shaped wiring regions 7 is generally several millimeters. The width of each of the pin connection regions 8 is generally several hundred microns. In this case, the width of the border region of the conventional display device is still too large, and not only the appearance of the display device but also the display effect of the display device are affected.

The conception of the display device provided by the present disclosure is described as followings. The panel pins are provided directly on the edge of the display panel and connected directly with the circuit board pins of the control circuit board. And then, connecting lines are provided on the control circuit board, and the circuit board pins are electrically connected with a driving chip by the connecting lines. In this case, the connecting lines in the fan-shaped regions are provided on the control circuit board and will not occupy the space in the non-display region of the display panel. The control circuit board can be folded to the back surface of the display panel. No additional space outside of the display panel is occupied. Therefore, the width of the border region of the display device can almost be reduced to be equal to the width of the pin connection region (region where the panel pins are connected to the board pins). This concept can be applied to the display device having any of a small, medium or large size.

The First Embodiment

The present embodiment provides a display device which may have a small size. The display panel is designed to have a narrow border. There are only one gate line driving circuit board and one data line driving circuit board in the display device.

Figure 3:
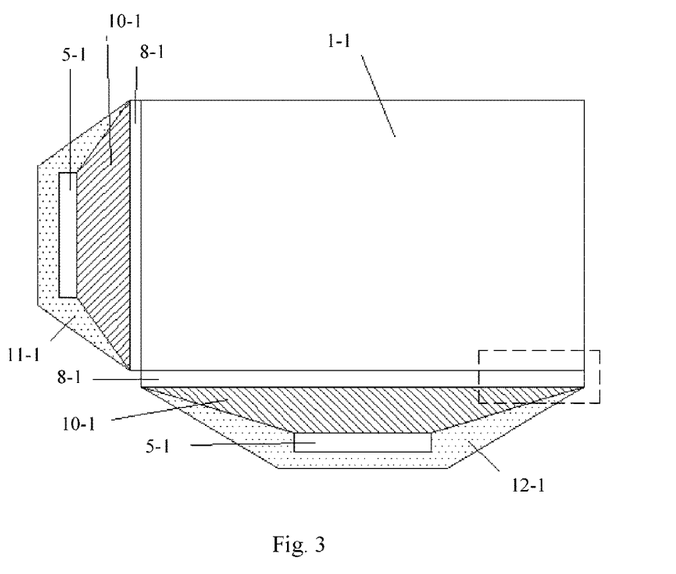
FIG. 3 is a schematic view showing a structure of a display device according to a first embodiment of the present disclosure.
Figure 4:
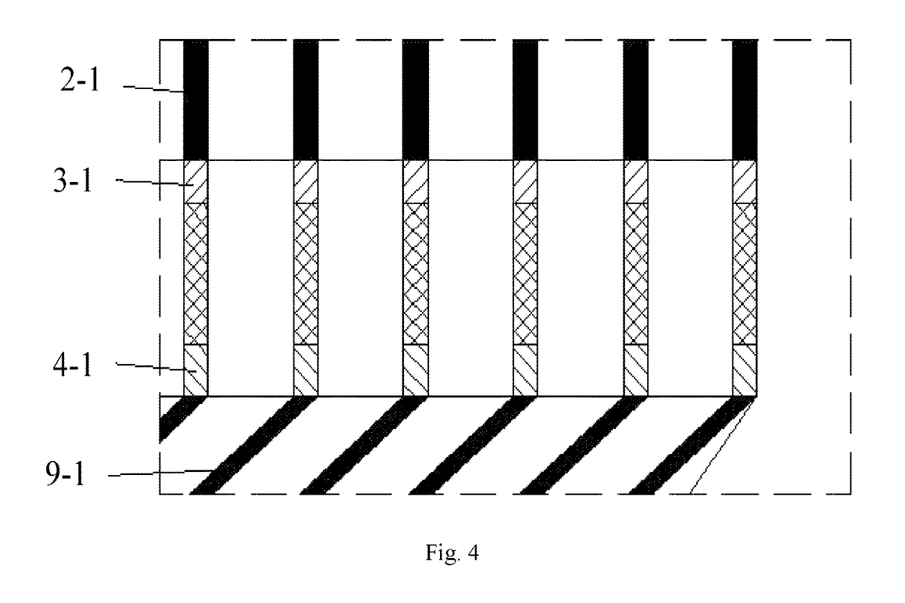
FIG. 4 is an enlarged view of a structure within a dashed box in FIG. 3.

FIG. 3 is a schematic view showing a structure of a display device according to the present embodiment. FIG. 4 is an enlarged view of a structure within a dashed box in FIG. 3. As shown in FIGS. 3 and 4, the display device comprises a display panel 1-1 and a control circuit board configured to provide driving signals to the display panel 1. The display panel 1-1 comprises a plurality of pixel structures of which pixel structures arranged in one row are connected to one gate line, and pixel structures arranged in one column are connected to one data line 2-1. The control circuit board comprises a driving chip 5-1. The end portion of each of the gate lines and the end portion of each of the data lines 2-1 are respectively provided with panel pins 3-1. The control circuit board is provided with circuit board pins 4-1. The spacing between adjacent panel pins 3-1 is equal to that between adjacent circuit board pins 4-1. The pins of the driving chip 5 are connected to the circuit board pins 4 through the connecting lines 9-1.

The spacing between adjacent circuit board pins 4-1 is greater than the spacing between adjacent pins of the driving chip 5-1 connected thereto, so that from the side where the circuit board pins 4-1 are located to the side where the pins of the driving chip 5-1 are located, the spacing between adjacent connecting lines 9-1 is gradually reduced. Therefore, the connecting wire 9-1 is in the form of a fan, and may be referred to as a fan-shaped wiring region 10-1. In this way, it may eliminate the gate line fan-shaped wiring regions 6-1 and the data line fan-shaped wiring regions 7-1 in the conventional display device. And at the same time, a connecting line fan-shaped wiring region 10-1 is added to the control circuit board. Therefore, the original function of each component can be ensured, and the width of the border region of the display device can be reduced.

Specifically, the control circuit board comprises a gate line driving circuit board 11-1 provided on a side of the display panel 1-1, which is perpendicular to the extending direction of the gate lines. That is, as shown in FIG. 3, the gate line driving circuit board 11-1 is provided on the left side of the display panel 1-1. The gate line driving circuit board 11-1 may also be provided on the right side of the display panel 1-1. The circuit board pins 4-1 are electrically connected to the panel pins 3-1 which are connected to the gate lines respectively.

The control circuit board also comprises a data line driving circuit board 12-1 provided on a side of the display panel 1-1, which is perpendicular to the extending direction of the data lines 2-1. That is, as shown in FIG. 3, the data line driving circuit board 12-1 is provided on the lower side of the display panel 1-1. The data line driving circuit board 12-1 may also be provided on the upper side of the display panel 1-1. The circuit board pins 4-1 are electrically connected to the panel pins 3-1 which are connected to the data lines 2-1 respectively.

As there are only one gate line driving circuit board 11-1 and one data line driving circuit board 12-1 in the display device of the present embodiment, all of the gate lines are connected to the one gate line driving circuit board 11-1, and all of the data lines 2-1 are connected to the one data line driving circuit board 12-1. Therefore, the spacing between adjacent panel pins 3-1 connected to the gate lines is equal to the spacing between adjacent gate lines. The spacing between adjacent panel pins 3-1 connected to the data lines 2-1 is equal to the spacing between adjacent data lines 2-1.

The display device in the present embodiment has structure that the spacing between adjacent panel pins and the spacing between adjacent circuit board pins are significantly larger than those in the conventional display device. Therefore, the interference between the pins can be significantly reduced to ensure the display quality.

In the display device according to the present embodiment, the panel pins 3-1 electrically connected to the gate lines or the data lines 2-1 are provided directly on the edge of the display panel 1-1. Accordingly, the circuit board pins 4-1 electrically connected to the panel pins 3-1 are provided directly on the edge of the gate line driving circuit board 11-1 and the data line driving circuit board 12-1. The regions where the panel pins 3-1 are electrically connected to the circuit board pins 4-1 are referred to as pin connection regions 8-1. Then, on the gate driving circuit board 11-1 or the data line driving circuit board 12-1, in an order from the side closer to the display panel 1-1 to the side away from display panel 1-1, the connecting lines 9-1 and the driving chip 5-1 are provided successively and the circuit board pins 4-1. The connecting lines 9-1 and the driving chip 5-1 are connected successively.

That is to say, both of the connecting lines 9-1 and the driving chips 5-1 are provided on a flexible circuit board. Thus, it may eliminate the gate line fan-shaped wiring regions 6-1 and the data line fan-shaped wiring regions 7-1 in the conventional display device. And at the same time, a connecting line fan-shaped wiring region 10-1 is added to the control circuit board and will not occupy the space in the non-display region of the display panel. The control circuit board can be folded to the back surface of the display panel 1-1 where no pixel structure is provided and will not occupy additional space outside of the display panel. Therefore, the width of the border region of the display device can almost be reduced to be equal to the width of the pin connection region 8-1. The width of the border region of the display device is significantly reduced. The design of a display device with narrow border is realized.

It is easy to be understood that any one of the gate line driving circuit board and the data line driving circuit board of the display device may be provided in accordance with the gate line driving circuit board 11-1 or the data line driving circuit board 12-1 in the present embodiment. The width of the border region of the side where the gate line driving circuit board is located can be reduced, or the width of the border region of the side where the data line driving circuit board is located can be reduced, and the design of a display device with narrow border is realized.

The Second Embodiment

The present embodiment provides a display device which may have a small-to-medium size or medium size. The display panel is designed to have a narrow border and is different from the display according to the first embodiment in that: according to the present embodiment, there are two gate line driving circuit boards provided respectively on two sides of the display panel, which are perpendicular to the extending direction of the gate lines in the display device.

Figure 5:
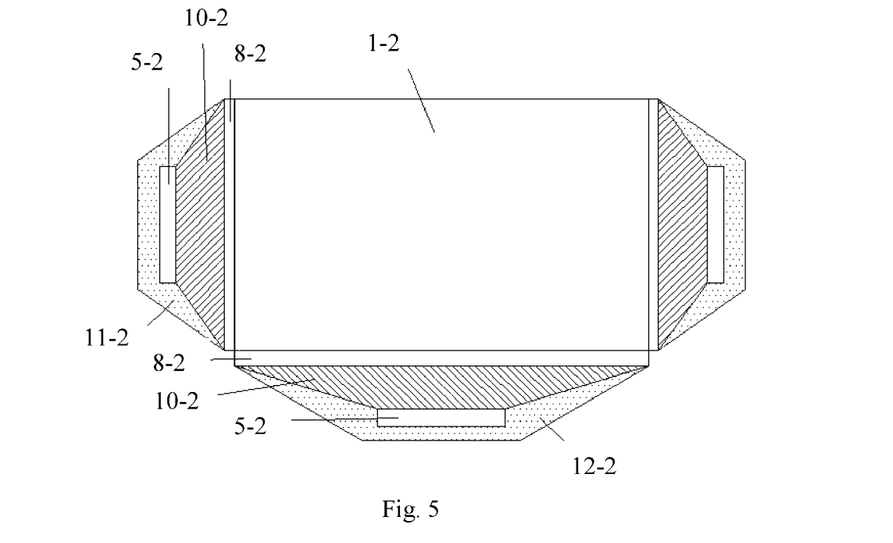
FIG. 5 is a schematic view showing a structure of a display device according to a second embodiment of the present disclosure.

FIG. 5 is a schematic view showing a structure of a display device according to the present embodiment. As shown in FIG. 5, the control circuit board comprises two gate line driving circuit boards 11-2 which are provided respectively on two sides of the display panel 1-2, which are perpendicular to the extending direction of the gate lines. That is, two gate line driving circuit boards 11-2 are respectively provided on the left side and right side of the display device. The circuit board pins are electrically connected, respectively, to the panel pins connected to the spaced gate lines. The regions where the panel pins are electrically connected to the circuit board pins are referred to as pin connection regions 8-2.

The control circuit board also comprises one data line driving circuit board 12-2 which is provided on one side of the display panel 1-2, which is perpendicular to the extending direction of the data lines. That is, as shown in FIG. 5, the data line driving circuit board 12-2 is provided on the lower side of the display panel 1-2. The data line driving circuit board 12-2 may also be provided on the upper side of the display panel 1-2. The circuit board pins are electrically connected, respectively, to the panel pins connected to the data lines.

Since there are two gate line driving circuit boards 11-2 in the display device of the present embodiment, half of the gate lines are electrically connected to the gate line driving circuit board 11-2 on the left side of the display panel 1-2, and the other half of the gate lines are electrically connected to the gate line driving circuit board 11-2 on the right side of the display panel 1-2. Preferable, each gate line at an odd/even position will be electrically connected to the gate line driving circuit board 11-2 on the left side of the display panel 1-2. Accordingly, the gate line at an even/odd position will be electrically connected to the gate line drive circuit board 11-2 on the right side of the display panel 1-2. All of the data lines will be connected to the same data line driving circuit board 12-2.

According to the display device in the present embodiment, the spacing between adjacent panel pins connected to the gate lines is twice as the spacing between adjacent gate lines. The spacing between adjacent panel pins connected to the data lines is equal to the spacing between adjacent data lines. The display device in the present embodiment has structure that the spacing between adjacent panel pins and the spacing between adjacent circuit board pins are significantly larger than those in the conventional display device. Therefore, the interference between the pins can be significantly reduced to ensure the display quality.

Other configuration of the display device of the present embodiment is the same as that of the display device in the first embodiment, and will not be repeated herein.

The display device of the present embodiment has an effect similar to that of the display device in the first embodiment. Fan-shaped connecting lines are provided on the control circuit board and will not occupy the space in the non-display region of the display panel. The control circuit board can be folded to stack on the back surface of the display panel and will not occupy additional space outside of the display panel. Therefore, the width of the border region of the display device can almost be reduced to be equal to the width of the pin connection region 8, and the design of a display device with narrow border is realized.

The Third Embodiment

The present embodiment provides a display device which may have a large size. The display panel is designed to have a narrow border and is different from the display according to the first embodiment in that: in the display device according to the present embodiment, there are two gate line driving circuit boards provided respectively on two sides of the display panel, which are perpendicular to the extending direction of the gate lines, and there are two data line driving circuit boards provided respectively on two sides of the display panel, which are perpendicular to the extending direction of the data lines.

Figure 6:
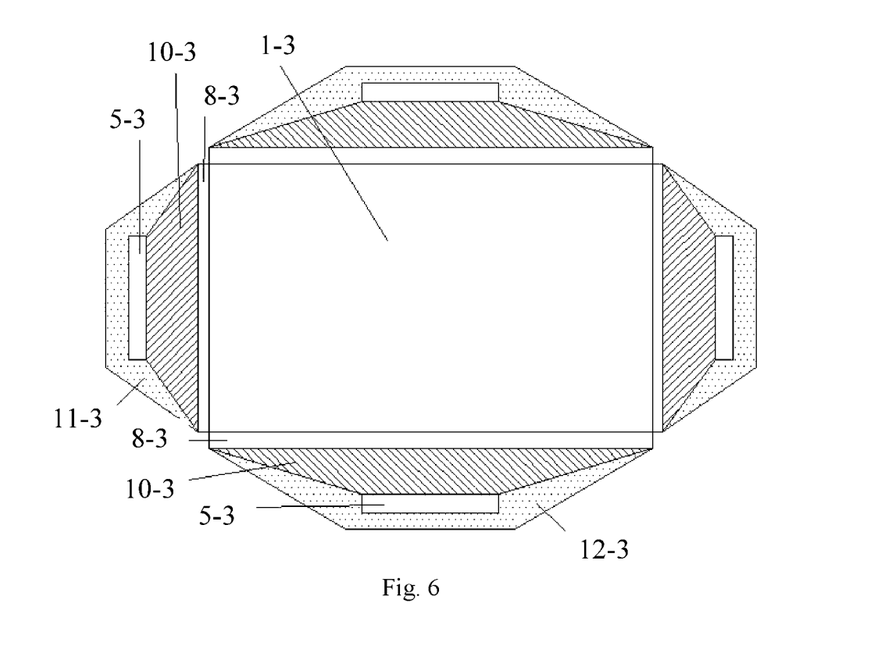
FIG. 6 is a schematic view showing a structure of a display device according to a third embodiment of the present disclosure.

FIG. 6 is a schematic view showing a structure of a display device according to the present embodiment. As shown in FIG. 6, the control circuit board comprises two gate line driving circuit boards 11-3 which are provided respectively on two sides of the display panel 1-3, which are perpendicular to the extending direction of the gate lines. That is, two gate line driving circuit boards 11-3 are respectively provided on the left side and the right side of the display panel 1-3. The circuit board pins are electrically connected, respectively, to the panel pins connected to the gate lines, and adjacent gate lines are spaced apart from each other. The regions where the panel pins are electrically connected to the circuit board pins are referred to as pin connection regions 8-3.

The control circuit board also comprises two data line driving circuit boards 12-3 which are provided respectively on two sides of the display panel 1-3, which are perpendicular to the extending direction of the data lines. That is, two data line driving circuit boards 12-3 are provided respectively on the upper side and the lower side of the display panel 1-3. The circuit board pins are electrically connected, respectively, to the panel pins which are connected to the data lines, and adjacent data lines are spaced apart from one another.

According to the display device in the present embodiment, the connection between the gate lines and the gate line driving circuit board 11-3 and the connection between the data lines and the data line driving circuit board 12-3 are the same as the connection between the gate lines and the gate line driving circuit board 11-3 in the second embodiment. That is, the spacing between adjacent panel pins connected to the gate lines is twice as the spacing between adjacent gate lines. The spacing between adjacent panel pins connected to the data lines is twice as the spacing between adjacent data lines. The spacing between adjacent pins is increased significantly. Therefore, the interference between adjacent pins can be furtherly reduced.

The other configuration of the display device of the present embodiment is the same as that of the display device in the first embodiment, and will not be repeated herein.

The display device of the present embodiment has an effect similar to that of the display device in the first embodiment. The width of the border region of the display device can almost be reduced to be equal to the width of the pin connection region 8-3. The design of a display device with narrow border is realized.

The Fourth Embodiment

The present embodiment provides a display device which may have a super large size. The display panel is designed to have a narrow border and is different from the display according to the first to the third embodiment in that: in the display device according to the present embodiment, the gate line driving circuit board and the data line driving circuit board comprise a plurality of driving chips arranged side by side.

Figure 7:
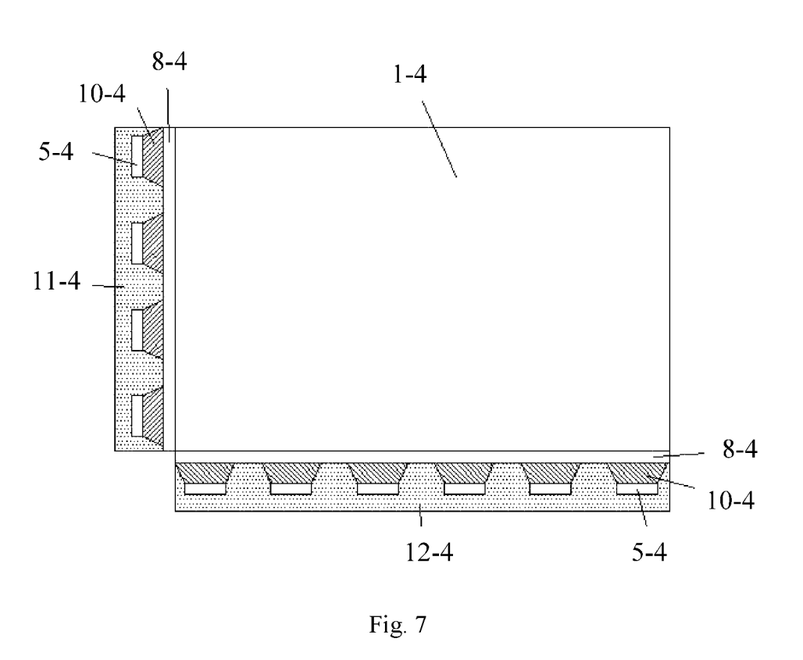
FIG. 7 is a schematic view showing a structure of a display device according to a fourth embodiment of the present disclosure.

FIG. 7 is a schematic view showing a structure of a display device according to the present embodiment. As shown in FIG. 7, the display device comprises one gate line driving circuit board 11-4 and one data line driving circuit board 12-4. The gate line driving circuit board 11-4 comprises a plurality of driving chips 5-4 arranged side by side. The data line driving circuit board 12-4 comprises a plurality of driving chips 5-4 arranged side by side. Each of the connecting wires is connected to a driving chip 5-4 in a position corresponding to the position of the connecting wire. That is, the plurality of driving chips 5-4 are used to supply drive signals to the display panel, thereby satisfying the drive demand of the display device having a super large size.

Figure 8:
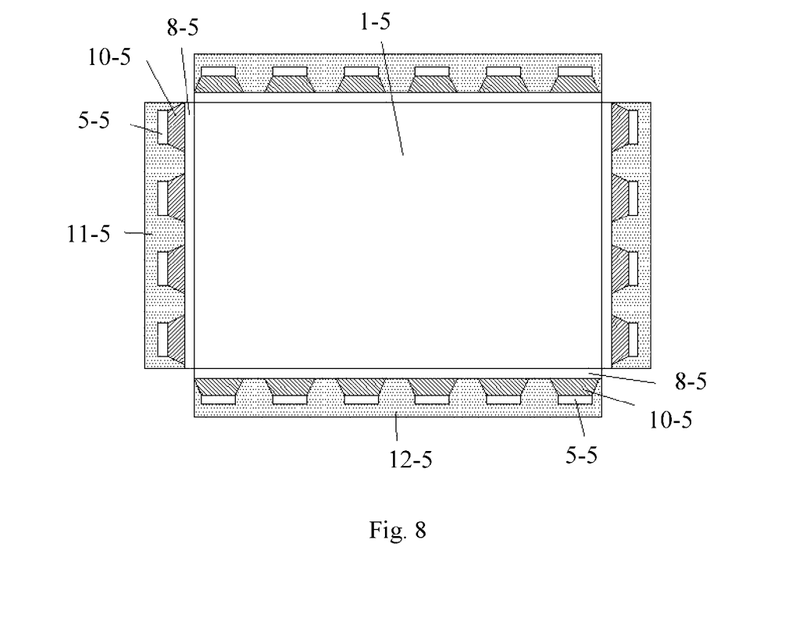
FIG. 8 is a schematic view showing another structure of a display device according to a fourth embodiment of the present disclosure.

FIG. 8 is a schematic view showing another structure of a display device according to the present embodiment. As shown in FIG. 8, the display device comprises two gate line driving circuit boards 11-5 and two data line driving circuit boards 12-5. Each of the gate line driving circuit boards 11-5 comprises a plurality of driving chips 5-5 arranged side by side. Each of the data line driving circuit boards 12-5 comprises a plurality of driving chips 5-5 arranged side by side. Each of the connecting wires is connected to a driving chip 5-5 in a position corresponding to the position of the connecting wire. The connection between the gate lines and the gate line driving circuit boards 11-5 and the connection between the data lines and the data line driving circuit boards 12-5 are the same as those in the third embodiment, thereby satisfying the drive demand of the display device having a larger size.

The other configuration of the display device of the present embodiment is the same as that of the display device in the first embodiment to the third embodiment, and will not be repeated herein.

According to the display device of the present embodiment, the design of a display device with narrow border is realized, and the display effect is improved.

It is to be understood that the above embodiments are merely exemplary embodiments employed for the purpose of illustrating the principles of the present disclosure, but the present disclosure is not limited thereto. It will be apparent to those skilled in the art that various changes and modifications can be made therein without departing from the spirit and spirit of the present disclosure, and such changes and modifications are also regarded to be within the scope of the present disclosure.

What is claimed is:

1. A display device, comprising a display panel and a control circuit board configured to provide a driving signal to the display panel, the display panel comprising a plurality of pixel structures of which the pixel structures arranged in one row are connected to one gate line, and the pixel structures arranged in one column are connected to one data line, the control circuit board comprising a driving chip, wherein an end portion of each of the gate lines and an end portion of each of the data lines are respectively provided with panel pins, the control circuit board is provided with circuit board pins to be electrically connected with the panel pins, and connecting lines through which pins of the driving chip are connected to the circuit board pins, a spacing between adjacent circuit board pins is larger than a spacing between adjacent pins of the driving chip connected with the circuit board pins, and a spacing between adjacent panel pins is equal to the spacing between adjacent circuit board pins.

2. The display device of claim 1, wherein from a side where the circuit board pins are located to another side where the pins of the driving chip are located, a spacing between adjacent connecting lines is gradually reduced.

3. The display device of claim 1, wherein the control circuit board comprises a gate line driving circuit board provided on a side of the display panel, which is perpendicular to an extending direction of the gate lines, the circuit board pins are electrically connected to the panel pins connected to the gate lines respectively, and a spacing between adjacent panel pins connected to the gate lines is equal to a spacing between adjacent gate lines.

4. The display device of claim 1, wherein the control circuit board comprises a data line driving circuit board provided on a side of the display panel, which is perpendicular to an extending direction of the data lines, the circuit board pins are electrically connected to the panel pins connected to the data lines respectively, and a spacing between adjacent panel pins connected to the data lines is equal to a spacing between adjacent data lines.

5. The display device of claim 1, wherein the control circuit board comprises a gate line driving circuit board and a data line driving circuit board, the gate line driving circuit board is provided on a side of the display panel, which is perpendicular to an extending direction of the gate lines, and the circuit board pins are electrically connected to the panel pins connected to the gate lines respectively, a spacing between adjacent panel pins connected to the gate lines is equal to a spacing between adjacent gate lines; and the data line driving circuit board is provided on a side of the display panel, which is perpendicular to an extending direction of the data lines, the circuit board pins are electrically connected to the panel pins connected to the data lines respectively, and a spacing between adjacent panel pins connected to the data lines is equal to a spacing between adjacent data lines.

6. The display device of claim 1, wherein the control circuit board comprises two gate line driving circuit boards provided on two sides of the display panel, which are perpendicular to an extending direction of the gate lines, the circuit board pins are electrically connected to the panel pins connected to gate lines respectively, adjacent gate lines are spaced apart from each other, and a spacing between adjacent panel pins connected to the gate lines is twice as a spacing between adjacent gate lines.

7. The display device of claim 6, wherein the control circuit board comprises one data line driving circuit board provided on a side of the display panel, which is perpendicular to an extending direction of the data lines, and the circuit board pins are electrically connected to the panel pins connected to the data lines respectively, a spacing between the adjacent panel pins connected to the data lines is equal to a spacing between adjacent data lines.

8. The display device of claim 6, wherein the control circuit board comprises two data line driving circuit boards provided respectively on two sides of the display panel, which are perpendicular to an extending direction of the data lines, the circuit board pins are electrically connected to the panel pins connected to data lines respectively, adjacent data line are spaced apart from each other, and a spacing between the adjacent panel pins connected to the data lines is twice as a spacing between adjacent data lines.

9. The display device of claim 3, wherein each of the gate line driving circuit board comprises a plurality of driving chips, each of the connecting lines is connected to one of the driving chips corresponding to the position of a connecting wire.

10. The display device of claim 5, wherein each of the gate line driving circuit board comprises a plurality of driving chips, each of the connecting lines is connected to one of the driving chips corresponding to the position of a connecting wire.

11. The display device of claim 6, wherein each of the gate line driving circuit board comprises a plurality of driving chips, each of the connecting lines is connected to one of the driving chips corresponding to the position of a connecting wire.

12. The display device of claim 4, wherein each of the data line driving circuit board comprises a plurality of driving chips, each of the connecting wires is connected to one of the driving chips corresponding to the position of a connecting wire.

13. The display device of claim 5, wherein each of the data line driving circuit board comprises a plurality of driving chips, each of the connecting wires is connected to one of the driving chips corresponding to the position of a connecting wire.

14. The display device of claim 7, wherein each of the data line driving circuit board comprises a plurality of driving chips, each of the connecting wires is connected to one of the driving chips corresponding to the position of a connecting wire.

15. The display device of claim 1, wherein the control circuit board is folded to a back surface of the display panel where no pixel structure is provided.

16. The display device of claim 2, wherein the control circuit board is folded to a back surface of the display panel where no pixel structure is provided.

17. The display device of claim 3, wherein the control circuit board is folded to a back surface of the display panel where no pixel structure is provided.

18. The display device of claim 4, wherein the control circuit board is folded to a back surface of the display panel where no pixel structure is provided.

* * * * *